INVENTORS.
Russell E. Fredrick,
Clarence R. Manser,
By Truman, Jackson, Bottle & Dienner Attys.

$10^3/T°K$

INVENTORS.
Russell E. Fredrick,
Clarence R. Manser,
By Brown, Jackson, Boettcher & Dienner
Atty's.

United States Patent Office 2,890,260

Patented June 9, 1959

2,890,260

ELECTRICAL CONDUCTOR ELEMENTS, METHOD OF MAKING SAME, AND CONTACTS THEREFOR

Russell E. Fredrick, White Bear Lake, Minn., and Clarence R. Manser, Appleton, Wis., assignors, by mesne assignments, to Minnesota Mining and Manufacturing Company, St. Paul, Minn., a corporation of Delaware Application February 14, 1958, Serial No. 715,454

31 Claims. (Cl. 136—5)

Figure 1:
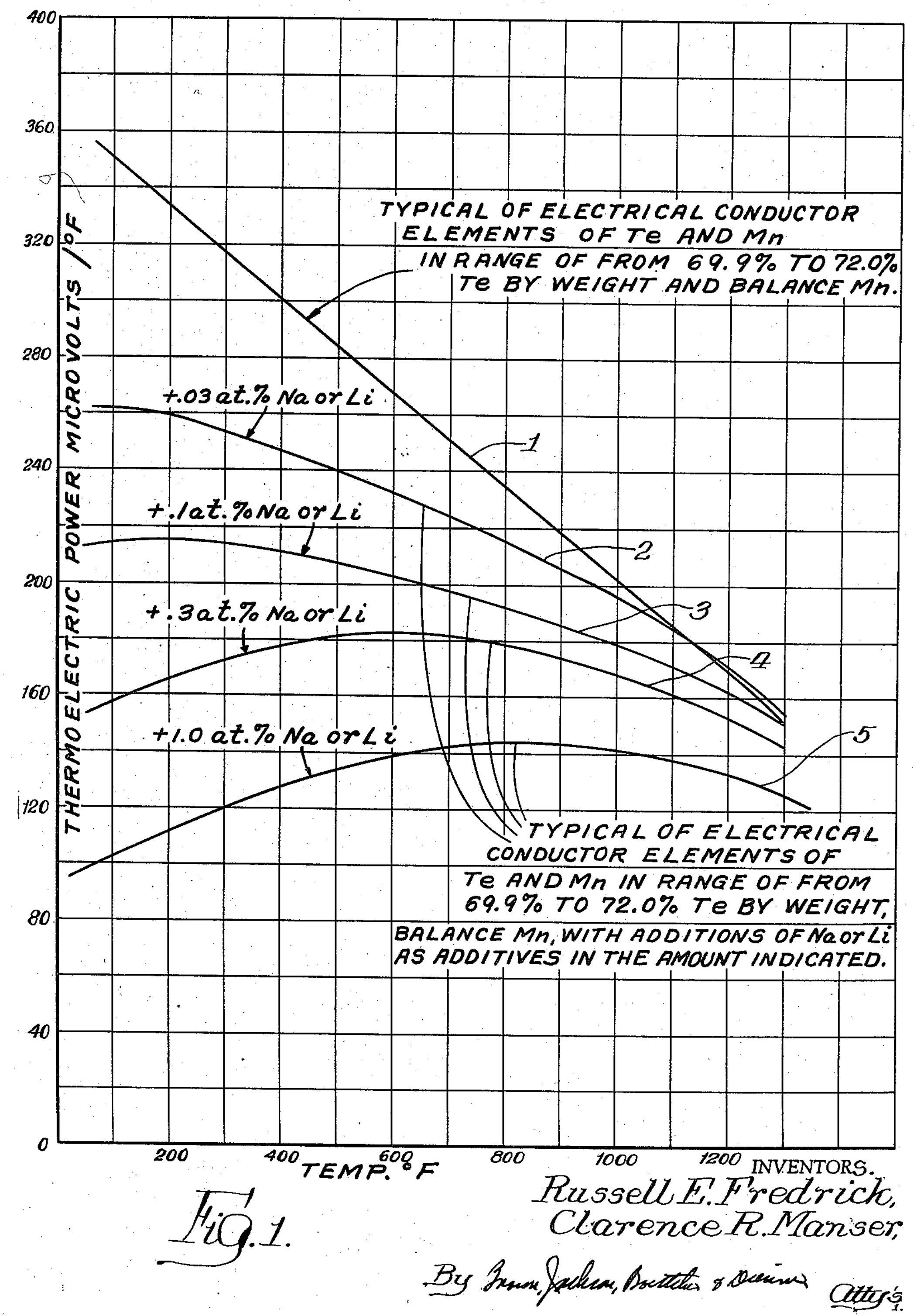

This invention relates to electrical conductor elements of inter-metallic compositions having semi-conductor like conductivity and composed in the main of manganese and tellurium.

It is an object of the invention to provide electrical conductor elements composed primarily of manganese and tellurium having desirable relationships of electrical resistivity, temperature co-efficients, thermoelectric power, and/or thermal conductivity to the end that one or more of such characteristics afford utility of such electrical conductor elements typically for thermoelectric and/or thermistor elements.

A further object of the invention is to provide electrical conductor elements of the aforesaid compositions in which the magnitudes of certain of the electrical characteristics thereof are reproducible within desired ranges therefor.

A further object of the invention is to provide electrical conductor elements of compositions above indicated in which the electrical conductivity is P-type.

A further object of the invention is to provide electrical conductor elements of compositions above indicated in which the electrical resistivity may be controlled in magnitude as desired.

A further object of the invention is to provide electrical conductor elements of compositions above indicated in which desired electrical resistivities therefor are reproducible.

Another object is to provide electrical conductor elements of compositions above indicated in which the thermoelectric power may be controlled in magnitude as desired.

Another object is to provide electrical conductor elements of compositions above indicated in which the polarity of thermoelectric power is positive.

Another object is to provide electrical conductor elements of compositions above indicated having desirable relationships of thermoelectric power and resistivity, and which are reproducible within desired ranges of such relationships.

Another object of the invention is to provide electrical conductor elements of compositions above indicated having desirable electrical resistivity and negative temperature co-efficients of electrical resistivity.

Another object is to provide methods of fabricating electrical conductor elements of manganese and tellurium having the aforementioned electrical characteristics to afford reproducibility and chemical stability.

Another object is to provide contact electrodes for association with the electrical conductor elements of the invention for affording utilization thereof.

Another object of the invention is to provide electrical conductor elements of compositions above indicated which are stable at temperatures much higher than electrical conductors presently known for thermoelectric purposes.

Another object is to provide electrical conductor elements of compositions above indicated which are not substantially altered by the presence of trace impurities normally found in the composition components.

Another object is to provide electrical conductor elements composed of compositions above indicated, together with chemical elements other than manganese or tellurium effective as P-type electrical conductivity promoters.

Another object is to provide electrical conductor elements of compositions above indicated in which the thermoelectric power is always P-type at all temperatures below the melting points of the compositions.

Figure 2:
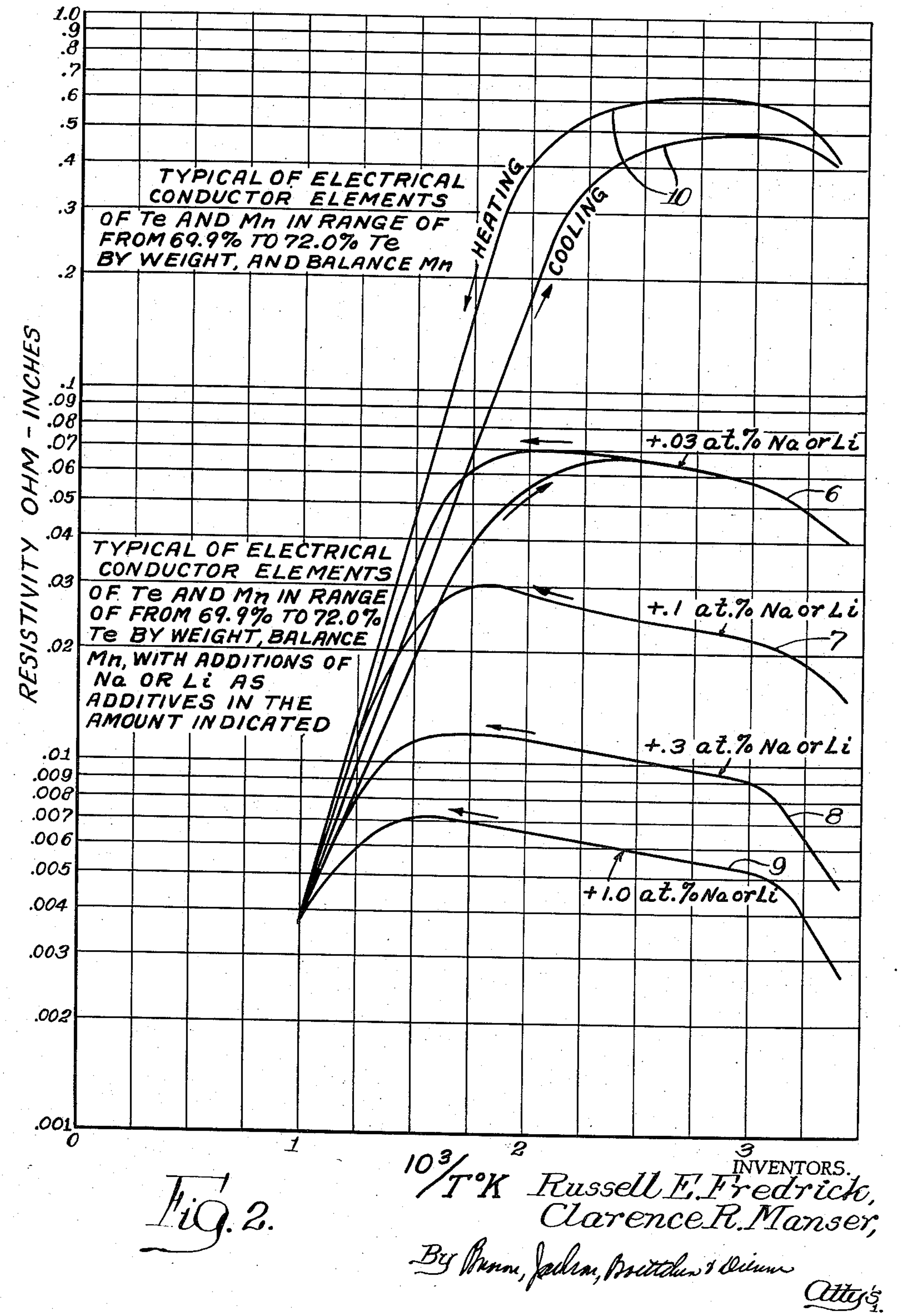

The above and other objects of the invention will become apparent from the following description taken in connection with the drawings in which:

Figure 1 is a graphic illustration of the general thermoelectric power characteristics in microvolts/° F. over a selected temperature range of a number of electrical conductor elements of this invention composed of manganese and tellurium within the hereinafter disclosed and claimed range, and said range of manganese and tellurium including certain additions of positive promoters therein;

Figure 2 is a graphic representation of the temperature dependence of the electrical resistivity expressed in ohm-inches log scale, plotted against the reciprocal of absolute (Kelvin) temperature, symbolically expressed as $10^3/T$. ° K., of electrical conductor elements of this invention composed of manganese and tellurium within the hereinafter disclosed and claimed range, and said range of manganese and tellurium including additions of positive promoters therein.

The electrical conductor elements of the present invention are inter-metallic compounds and consist essentially of manganese and tellurium within the range of from 69.9% to 72.0%, by weight, tellurium, and the balance substantially all manganese. The aforementioned compositions may contain other matter in trace amounts without deleteriously affecting the utility of the compositions for electrical conductor purposes as hereinafter related, but such impurity should not exceed an order of magnitude of .01%, by weight, except for addition of positive promoters, of which, as examples, sodium and lithium as herein specifically disclosed and claimed, may be present in amounts up to maximum concentrations of one atomic percent. As will hereinafter appear, the addition of positive promoter chemical elements, other than the elements manganese and tellurium of which the compositions mainly consist, are effective to enhance certain of the electrical properties of the disclosed and claimed electrical conductor elements.

The electrical conductor elements of this invention may be formed from the compositions aforementioned, and such compositions may be suitably prepared in the following manner:

The electrical conductors of this invention may be prepared by reacting pure unoxidized manganese directly with tellurium in appropriate proportions to afford the aforementioned range in a refractory container which does not react with the components. However, owing to inconveniences in preparing electrical conductors of this invention with starting constituents of manganese and tellurium, it is preferable to first reduce commercial electrolytic manganese which normally contains a small amount of manganese oxide in a carbon crucible and an inert atmosphere, for a period of several minutes at a temperature of 2600° F. which converts all of the manganese oxide and metal to manganese carbide ($Mn_3C$). The manganese carbide and tellurium in suitable amounts to afford the aforementioned range of tellurium of from 69.9% to 72.0% by weight, balance manganese, in the end composition are then reacted in a carbon crucible under a suitable atmosphere such as hydrogen or $CO_2$. The aforementioned reaction between the manganese carbide and tellurium is violent and it is desirable that the crucible be fitted loosely with a carbon cap to prevent material from splattering out of the crucible. It is advantageous in carrying out the aforementioned reaction to use a tellurium excess over the amount of tellurium required to form the inter-metallic compounds of manganese and tellurium of the aforementioned range of the order of 0.5 weight percent, or more, to insure the complete reaction with the manganese carbide. The rate of reaction of $Mn_3C$ and Te or metallic Mn and Te is quite low, and we have found that this reaction rate can be raised substantially by increasing the proportion of tellurium in the initial melt over that desired in the final composition. The additional tellurium over and above the aforesaid range, present in the melt as undesirable excesses in the form of $MnTe_2$, may be removed to bring the composition within the aforementioned range of manganese and tellurium by vacuum melting of the material. In such vacuum melting the equilibrium $MnTe_2 \rightleftarrows MnTe+Te$ is shifted to the right as the temperature is raised and the tellurium may be removed from the melt by reducing the pressure over the melt and allowing the tellurium to condense on a cooler section of the system. By holding the temperature of the melt above the melting point of MnTe (2150° F.) while reducing the pressure to the order of .1" Hg will, in several minutes, the time depending on how much tellurium is to be removed, to bring the composition within the aforesaid range, an almost pure metallographic phase will be produced, for which the vapor pressure of tellurium over the solid is negligible at temperatures up to its melting point.

The aforesaid range of manganese and tellurium for this invention is deemed to be critical. Should, for example, the manganese concentration exceed 30.1% by weight of the total composition of manganese and tellurium, such excess manganese, occurring as $Mn_3C$ when the aforedescribed method of preparation is followed, may be distributed throughout the ingot and tends to short circuit the thermal electromotive force. Further, as to tellurium excesses over and above 69.9% by weight of the total composition of manganese and tellurium combine with the single phase MnTe to form $MnTe_2$ which can be accommodated up to 72.0% tellurium by weight of the total composition of manganese and tellurium. Thus, unlike manganese excesses of the aforementioned range, the electrical conductors of this invention can accommodate 8% by weight excess tellurium in the aforementioned form of $MnTe_2$ without appreciable significant reduction in thermoelectric power as hereinafter related.

Turning again to the method aspects of this invention, it is expedient to incorporate all of the above operations of reducing, reacting, and removing excess tellurium to provide electrical conductor elements within the above range of manganese and tellurium in one heating cycle. This can be done by putting appropriate proportions of manganese, carbide and tellurium in a closed carbon mold, and then heating the same to the order of 2600° F. for several minutes under an atmosphere of inert gas. The temperature is then reduced slightly and the mold is evacuated to remove the excess tellurium from the melt by vaporization. The released carbon from $Mn_3C$ will form an insignificant scum on the surface of the solidified ingot.

The electrical conductor elements produced, as above discussed, may have their electrical conductivities increased by the addition, in a conventional way, of P-type additions or promoters, as for example, sodium or lithium up to concentrations of one atomic percent.

In the graph of Figure 1 of the drawings, the curve bearing reference numeral 1, generally indicates the thermoelectric power in microvolts per ° F. as against temperature in range there exhibited of compositions of tellurium and manganese, in which tellurium ranges from 69.9% to 72.0%, by weight, and the balance substantially all manganese. The curves indicated at 2, 3, 4 and 5 give the resultant characteristics of the additions of .03 atomic percent sodium or lithium; .1 atomic percent sodium or lithium; .3 atomic percent sodium or lithium; and 1.0 atomic percent sodium or lithium, to tellurium and manganese in the aforementioned range. The reduction of thermoelectric power as exhibited by Figure 1 by the utilization of positive promoter elements, as sodium or lithium, is accompanied by reduction in electrical resistivity as shown, for example, in Figure 2 by curves 6, 7, 8, and 9 respectively. In Figure 2, the general graphic representation of unpromoted tellurium and manganese in the range of from 69.9% to 72.0% tellurium by weight and balance substantially all manganese is exhibited by curve 10. In regard to the several curves of Figure 2, it will be readily apparent that they are characterized by desirable negative temperature co-efficients, it being observed that Figure 2 represents the log of the electrical resistivity expressed in ohm-inches plotted, as previously noted, for convenience against the reciprocal of absolute (Kelvin) temperature, symbolically expressed $10^3/T.$ °K. It will be observed from an examination of Figures 1 and 2 that nominal loss of thermoelectric power is more than offset by reduced electrical resistivity of the promoted manganese-tellurium conductor elements of this invention.

As previously indicated, any residual impurities occurring in electrolytic manganese is not effective to alter the conductivity of the electrical conductor elements of this invention as do the positive promoter elements sodium and lithium by reason of which elementary pure materials are not required in order to provide reproducible results providing unknown or trace impurities do not exceed an order of magnitude .01% by weight of the manganese and tellurium.

Electrical conductor elements produced in accordance with the aforementioned methods are always P-type at all temperatures below the melting points of the compositions. It is known in the art that materials, intrinsically N-type, can be rendered P-type by impurity additions but such materials suffer a change in thermoelectric power by being modified as the temperature is raised, which is a disadvantage not suffered by the present invention. Additionally, the electrical conductor elements of this invention may be operated at high temperatures, approaching 1600° F., without sublimation of the conductor element.

The electrical condutcor elements of the invention may be formed as above described by simple casting procedures into any desired shape. The physical strength is sufficient to permit the machining of cast polycrystalline ingots.

The aforedescribed electrical conductor elements of this invention may be mechanically and electrically contacted by eutectic welding to P-type lead tellurium elements containing a stoichiometric excess of lead, for example, the P-type lead excess compositions disclosed in United States Patent No. 2,811,440, dated October 29, 1957, to Robert W. Fritts and Sebastian Karrer and owned by the assignee of this application. Contacting of the electrical conductor elements of this invention, with the aforementioned P-type lead excess lead tellurium composition, may be accomplished by holding an electrical conductor element of this invention and the contact in intimate association in a carbon mold surrounded by an inert atmosphere and heating them to a temperature of 1600° F. for twenty seconds, after which the electrical conductor element, contact, and mold are rapidly cooled which results in the contact being fused to the electrical conductor element. Further, pressure contacts of the electrical conductor elements of this invention to alloy steel are suitable for hot junction operation of the electrical conductor elements of this invention for thermoelectrical purposes.

Further, electrical contact may be made with the electrical conductor elements of this invention by fusing together the electrical conductor element with an Mo-Fe electrode previously wetted with a small amount of a lead rich lead tellurium composition doped, for example, with sodium as disclosed in the patent above mentioned. In this instance, the lead excess, lead-tellurium sodium doped composition acts as a solder joining the iron electrode and the electrical conductor element.

In the utilization of the electrical conductor elements of this invention, at high temperatures, i.e., in thermoelectric generators, the conductor elements should be hermetically incapsulated in an oxygen free environment.

If desired, annealing of the electrical condutcor elements above described may be accomplished to the end of improving the same. This may be accomplished by annealing the electrical conductor elements for several hours at 1400° F. and allowing the electrical conductor elements to furnace cool with the operation being accomplished in a reducing atmosphere. The annealing step results in stabilizing the properties of the electrical conductor elements at high temperature operations, such as for thermoelectric purposes.

In connection with electrical conductor elements in the range of from 69.9% to 72.0% tellurium, balance essentially all manganese, it has been observed that at the higher tellurium concentrations operating temperatures may be somewhat limited by the vaporization of tellurium. However, where high temperature operation is not important simplification of the production of the electrical conductor elements of this invention may be affected by the use of the greater amount of tellurium and eliminating the vacuum melting procedure without seriously effecting the electrical properties of the electrical conductor elements.

In utilization of the electrical conductor elements of the present invention, for thermoelectric purposes, it has been observed that the elements of this invention are superior to other known thermoelectric materials at temperatures above 800° F. And, it is believed that the electrical conductor elements of this invention are capable for a hot junction operating temperature approaching 1600° F.

It is apparent that efficient thermoelectric generators may be made by utilizing the aforementioned electrical conductor element with a second known thermoelectric element, such as the negative thermoelectric elements of, for example of Patents No. 2,811,570 and No. 2,811,571, both owned by the assignee of the present application, or of stainless steel. Similarly thermistor devices may utilize the electrical conductor elements of this application by suitable contacting thereof as above described.

We claim:

1. An electrical conductor element consisting essentially of from 69.9% to 72.0% tellurium by weight, and the balance substantially all manganese.

2. An electrically positive conductor element consisting essentially of from 69.9% to 72.0% tellurium by weight, and the balance substantially all manganese, and in which any deleterious impurity present does not exceed an order of magnitude of 0.01% by weight of said tellurium and manganese.

3. An electrically positive conductor element consisting essentially of from 69.9% to 72.0% tellurium by weight, and the balance substantially all manganese, and containing a positive promoter element to afford reproducible variation of and control over the electrical properties of the conductor.

4. An electrically positive conductor element consisting essentially of from 69.9% to 72.0% tellurium by weight, and the balance substantially all manganese, and containing a positive promoter element not in excess of 1 atomic percent to afford reproducible variation of and control over the electrical properties of the conductor.

5. An electrically positive conductor element consisting essentially of from 69.9% to 72.0% tellurium by weight, and the balance substantially all manganese, and in which any deleterious impurity present does not exceed an order of magnitude of 0.01% by weight of said tellurium and manganese, and containing a positive promoter element to afford reproducible variation of and control over the electrical properties of the conductor.

6. An electrically positive conductor element consisting essentially of from 69.9% to 72.0% tellurium by weight, and the balance substantially all manganese, and containing a positive promoter element selected from the group consisting of sodium and lithium not in excess of 1 atomic percent.

7. An electrically positive conductor element consisting essentially of from 69.9% to 72.0% tellurium by weight, and the balance substantially all manganese, and in which any deleterious impurity present does not exceed an order of magnitude of 0.01% by weight of said tellurium and manganese, and containing a positive promoter element selected from the group consisting of sodium and lithium not in excess of 1 atomic percent.

8. An electrically positive conductor element consisting essentially of from 69.9% to 72.0% tellurium by weight, and the balance substantially all manganese, and in which any deleterious impurity present does not exceed an order of magnitude of 0.01% by weight of said tellurium and manganese, and containing sodium not in excess of 1 atomic percent.

9. An electrically positive conductor element consisting essentially of from 69.9% to 72.0% tellurium by weight, and the balance substantially all manganese, and in which any deleterious impurity present does not exceed an order of magnitude of 0.01% by weight of said tellurium and manganese, and containing lithium not in excess of 1 atomic percent.

10. A thermoelectric conductor element consisting essentially of from 69.9% to 72.0% tellurium by weight, and the balance substantially all manganese.

11. A thermoelectric conductor element consisting essentially of from 69.9% to 72.0% tellurium by weight, and the balance substantially all manganese, and containing a positive promoter element to afford reproducible variation of and control over the electrical properties of the conductor element.

12. A thermoelectric conductor element consisting essentially of from 69.9% to 72.0% tellurium by weight, and the balance substantially all manganese, and containing a positive promoter element not in excess of 1 atomic percent to afford reproducible variation of and control over the electrical properties of the conductor element.

13. A thermoelectric conductor element consisting essentially of from 69.9% to 72.0% tellurium by weight, and the balance substantially all manganese, and containing a positive promoter element selected from the group consisting of sodium and lithium not in excess of 1 atomic percent.

14. A thermoelectric conductor element consisting essentially of from 69.9% to 72.0% tellurium by weight, and the balance substantially all manganese, and in which any deleterious impurity present does not exceed an order of magnitude of 0.01% by weight of said tellurium and manganese, and containing a positive promoter element selected from the group consisting of sodium and lithium not in excess of 1 atomic percent.

15. A thermoelectric conductor element consisting essentially of from 69.9% to 72.0% tellurium by weight, and the balance substantially all manganese, and in which any deleterious impurity present does not exceed an order of magnitude of 0.01% by weight of said tellurium and manganese, and containing sodium not in excess of 1 atomic percent.

16. A thermoelectric conductor element consisting essentially of from 69.9% to 72.0% tellurium by weight, and the balance substantially all manganese, and in which any deleterious impurity present does not exceed an order of magnitude of 0.01% by weight of said tellurium and manganese, and containing lithium not in excess of 1 atomic percent.

17. A thermoelectric generator comprising a thermoelectric conductor element consisting essentially of from 69.9% to 72.0% tellurium and the balance substantially all manganese, and containing a positive promoter element selected from the group consisting of sodium and lithium not in excess of 1 atomic percent, and a second thermoelectric conductor element.

18. A thermistor conductor element consisting essentially of from 69.9% to 72.0% tellurium by weight, and the balance substantially all manganese.

19. A thermistor conductor element consisting essentially of from 69.9% to 72.0% tellurium by weight, and the balance substantially all manganese, and in which any deleterious impurity does not exceed an order of magnitude of 0.01% by weight of said tellurium and manganese.

20. A thermistor conductor element consisting essentially of from 69.9% to 72.0% tellurium by weight, and the balance substantially all manganese, and in which any deleterious impurity does not exceed an order of magnitude of 0.01% by weight of said tellurium and manganese, and a promoter element not in excess of 1 atomic percent concentration in said tellurium and manganese.

21. The method of forming electrical conductor elements which comprises reacting manganese and tellurium to afford compositions consisting essentially of manganese and tellurium, and in which tellurium is present in a range of from 69.9% to 72.0% by weight, and the balance substantially all manganese.

22. The method of forming electrical elements of tellurium and manganese in which tellurium is present in a range of from 69.9% to 72.0% by weight, and the balance substantially all manganese comprising, reacting manganese and tellurium in amounts including an excess of tellurium over said range under heat, and removing said excess tellurium.

23. The method of forming compositions of tellurium and manganese in which tellurium is present in a range of from 69.9% to 72.0% by weight, and the balance substantially all manganese comprising, reacting manganese carbide and tellurium in amounts including an excess of tellurium over said range under heat, and removing said excess tellurium.

24. The method of forming compositions of tellurium and manganese in which tellurium is present in a range of from 69.9% to 72.0% by weight, and the balance substantially all manganese comprising reacting manganese carbide and tellurium in amounts including an excess of at least 0.5 weight percent tellurium over said range in a closed mold for several minutes at a temperature of the order of 2600° F., and then lowering said temperature and removing tellurium in excess of said range by vaporization.

25. An article of manufacture comprising an electrical conductor consisting essentially of from 69.9% to 72.0% tellurium by weight, and the balance substantially all manganese, and a contact electrode of P-type lead tellurium containing a stoichiometric excess of lead for said conductor.

26. An article of manufacture comprising an electrical conductor consisting essentially of from 69.9% to 72.0% tellurium by weight, and the balance substantially all manganese, and a molybdenum-iron contact electrode secured to said electrical conductor by a P-type lead-tellurium composition containing a stoichiometric excess of lead.

27. An article of manufacture comprising an electrical conductor consisting essentially of from 69.9% to 72.0% tellurium by weight, and the balance substantially all manganese, and a molybdenum-iron contact electrode secured to said electrical conductor by a lead excess, lead-tellurium sodium doped composition.

28. The method which comprises forming a composition consisting essentially of from 69.9% to 72.0% tellurium by weight, and the balance substantially all manganese, and annealing said composition for several hours at about 1400° F. and allowing the composition to cool in a reducing atmosphere.

29. An electrical conductor element of tellurium and manganese in which tellurium is present in a range of 69.9% to 72.0% by weight, and the balance substantially all manganese comprising, the product of manganese carbide and tellurium in amounts affording said range with an excess of tellurium in amount of 0.5% by weight reacted for several minutes at a temperature of the order of 2600° F., and from which tellurium in excess of said range is removed by vaporization.

30. The electrical conductor element of claim 29 in which any deleterious impurity present does not exceed an order of magnitude of 0.01% by weight of the conductor element.

31. The electrical conductor element of claim 30 containing a positive promoter element selected from the group consisting of sodium and lithium in amount not in excess of 1 atomic percent.

No references cited.